(12) United States Patent
Kuwako et al.

(10) Patent No.: US 9,924,597 B2
(45) Date of Patent: Mar. 20, 2018

(54) COPPER CLAD LAMINATE FOR FORMING OF EMBEDDED CAPACITOR LAYER, MULTILAYERED PRINTED WIRING BOARD, AND MANUFACTURING METHOD OF MULTILAYERED PRINTED WIRING BOARD

(71) Applicant: MITSUI MINING & SMELTING CO., LTD., Tokyo (JP)

(72) Inventors: Fujio Kuwako, Saitama (JP); Toshifumi Matsushima, Saitama (JP); Toshihiro Hosoi, Saitama (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 0 days.

(21) Appl. No.: 15/111,305

(22) PCT Filed: Feb. 20, 2015

(86) PCT No.: PCT/JP2015/054832
§ 371 (c)(1),
(2) Date: Jul. 13, 2016

(87) PCT Pub. No.: WO2015/125928
PCT Pub. Date: Aug. 27, 2015

(65) Prior Publication Data
US 2016/0330839 A1  Nov. 10, 2016

(30) Foreign Application Priority Data
Feb. 21, 2014  (JP) .................................. 2014-032288

(51) Int. Cl.
*H05K 1/09* (2006.01)
*H05K 1/16* (2006.01)
(Continued)

(52) U.S. Cl.
CPC ............. *H05K 1/162* (2013.01); *B32B 15/00* (2013.01); *B32B 15/04* (2013.01); *B32B 15/20* (2013.01);
(Continued)

(58) Field of Classification Search
CPC .. H05K 1/02; H05K 1/16; H05K 1/18; H05K 1/162; H05K 3/00; H05K 3/06;
(Continued)

(56) References Cited

U.S. PATENT DOCUMENTS 5,155,655 A    10/1992  Howard et al.
5,619,795 A *   4/1997  Miyoshi .................. F16J 9/068
                                                      29/888.01
(Continued)

FOREIGN PATENT DOCUMENTS

EP    1422055 A1   5/2004
JP    2738590 B    4/1998
(Continued)

OTHER PUBLICATIONS

Office Action issued in Taiwan Counterpart Patent Appl. No. 104105902, dated Oct. 12, 2016, along with an English translation thereof.
(Continued)

*Primary Examiner* — Xiaoliang Chen
(74) *Attorney, Agent, or Firm* — Greenblum & Bernstein, P.L.C.

(57) ABSTRACT

A material for forming of the capacitor layer which generates no crack in drilling on the dielectric layer of the capacitor in manufacturing of a highly multilayered printed wiring board embedded a capacitor circuit. Copper clad laminate for forming of an embedded capacitor layer of a multilayered printed wiring board including an embedded capacitor circuit having a layer structure of copper layer/
(Continued)

dielectric layer of the capacitor/copper layer in an inner layer characterized in that the composite elastic modulus Er of the resin film constituting the dielectric layer of the capacitor along the thickness direction is less than 6.1 GPa is employed.

4 Claims, 7 Drawing Sheets

(51) Int. Cl.
    B32B 15/00    (2006.01)
    B32B 15/04    (2006.01)
    B32B 15/20    (2006.01)
    H05K 3/02     (2006.01)
    H05K 3/46     (2006.01)
    H05K 1/02     (2006.01)
    H05K 1/11     (2006.01)
    H05K 3/00     (2006.01)
    H05K 3/42     (2006.01)

(52) U.S. Cl.
    CPC ............ *H05K 1/0298* (2013.01); *H05K 1/09* (2013.01); *H05K 1/115* (2013.01); *H05K 3/0047* (2013.01); *H05K 3/022* (2013.01); *H05K 3/429* (2013.01); *H05K 3/4623* (2013.01); *H05K 3/4644* (2013.01); *B32B 2307/51* (2013.01); *B32B 2457/00* (2013.01); *B32B 2457/08* (2013.01); *B32B 2457/16* (2013.01); *H05K 2201/09763* (2013.01)

(58) Field of Classification Search
    CPC .. H05K 3/10; H05K 3/30; H05K 3/46; H05K 7/00; H05K 7/06; B44C 1/22
    USPC ........ 174/257, 256, 260, 262, 265; 361/271, 361/748, 762; 216/17
    See application file for complete search history.

(56) References Cited

U.S. PATENT DOCUMENTS

| | | | |
|---|---|---|---|
| 5,840,028 A * | 11/1998 | Chubachi | A61B 8/485 600/437 |
| 5,872,393 A * | 2/1999 | Sakai | H01L 23/49894 257/664 |
| 6,370,013 B1 * | 4/2002 | Iino | H01G 4/2325 257/E23.062 |
| 6,435,368 B1 * | 8/2002 | Yamanaka | B21D 51/383 220/268 |
| 6,757,178 B2 * | 6/2004 | Okabe | H01L 21/4857 257/E23.062 |
| 6,847,527 B2 | 1/2005 | Sylvester et al. | |
| 2001/0020736 A1 * | 9/2001 | Nakazawa | B29C 45/34 257/678 |
| 2002/0120060 A1 * | 8/2002 | Biteau | C01B 33/16 524/755 |
| 2003/0219969 A1 * | 11/2003 | Saito | H01L 21/4857 438/622 |
| 2004/0012938 A1 | 1/2004 | Sylvester et al. | |
| 2004/0118600 A1 * | 6/2004 | Lee | H05K 1/162 174/260 |
| 2004/0118602 A1 * | 6/2004 | Lee | H05K 1/162 174/260 |
| 2004/0167759 A1 * | 8/2004 | Kawakami | G06F 17/5009 703/6 |
| 2004/0170006 A9 | 9/2004 | Sylvester et al. | |
| 2004/0231885 A1 * | 11/2004 | Borland | H05K 1/162 174/260 |
| 2004/0256731 A1 * | 12/2004 | Mao | C08L 65/00 257/773 |
| 2005/0242997 A1 * | 11/2005 | Dunn | H05K 1/162 343/700 MS |
| 2006/0120015 A1 * | 6/2006 | Borland | H01L 27/013 361/306.3 |
| 2006/0138591 A1 * | 6/2006 | Amey, Jr. | H01L 23/49822 257/532 |
| 2006/0151863 A1 * | 7/2006 | Das | H01L 23/49822 257/678 |
| 2006/0152334 A1 * | 7/2006 | Maercklein | H01C 7/003 338/210 |
| 2006/0154434 A1 * | 7/2006 | Das | H05K 1/162 438/393 |
| 2006/0196691 A1 * | 9/2006 | Ahn | H05K 1/162 174/256 |
| 2006/0203456 A1 * | 9/2006 | Sohn | H05K 1/162 361/748 |
| 2006/0231290 A1 | 10/2006 | Kariya et al. | |
| 2006/0282999 A1 * | 12/2006 | Majumdar | H05K 1/162 29/25.42 |
| 2007/0045815 A1 * | 3/2007 | Urashima | H05K 1/0231 257/698 |
| 2007/0076392 A1 * | 4/2007 | Urashima | H01G 2/06 361/763 |
| 2007/0108552 A1 * | 5/2007 | Wan | H05K 1/162 257/532 |
| 2007/0139864 A1 * | 6/2007 | Dunn | H01G 9/0032 361/523 |
| 2007/0143993 A1 * | 6/2007 | Hsu | H05K 1/0231 29/832 |
| 2007/0147014 A1 * | 6/2007 | Chang | H05K 1/162 361/760 |
| 2007/0171326 A1 * | 7/2007 | Taguchi | G06F 3/0436 349/63 |
| 2007/0242440 A1 * | 10/2007 | Sugaya | H01L 23/3128 361/762 |
| 2007/0295532 A1 | 12/2007 | Kariya et al. | |
| 2008/0149384 A1 * | 6/2008 | Kawabe | H01L 23/49822 174/265 |
| 2008/0218932 A1 * | 9/2008 | Berlin | H05K 1/162 361/271 |
| 2008/0244885 A1 * | 10/2008 | Dunn | H01G 4/008 29/25.41 |
| 2008/0257480 A1 * | 10/2008 | Nakamura | H05K 1/162 156/150 |
| 2008/0289865 A1 * | 11/2008 | Nakamura | H05K 1/162 174/260 |
| 2009/0077799 A1 * | 3/2009 | Yang | H05K 1/162 29/846 |
| 2009/0090547 A1 | 4/2009 | Kariya et al. | |
| 2009/0140400 A1 * | 6/2009 | Amey, Jr. | H05K 1/162 257/664 |
| 2010/0060381 A1 * | 3/2010 | Das | H05K 1/162 333/172 |
| 2010/0084175 A1 * | 4/2010 | Suzuki | H01L 21/4857 174/260 |
| 2010/0181285 A1 * | 7/2010 | Tanaka | H01G 4/232 216/17 |
| 2011/0018099 A1 * | 1/2011 | Muramatsu | H01L 21/4857 257/532 |
| 2011/0049689 A1 * | 3/2011 | Iwasaki | H01L 23/295 257/675 |
| 2011/0100700 A1 | 5/2011 | Kariya et al. | |
| 2012/0168217 A1 * | 7/2012 | Hsu | H01L 23/49822 174/260 |
| 2012/0201610 A1 * | 8/2012 | Yasui | E02B 3/26 405/215 |
| 2012/0307469 A1 * | 12/2012 | Oka | H01G 4/33 361/782 |
| 2013/0248235 A1 * | 9/2013 | Hsu | H01L 23/49822 174/260 |

FOREIGN PATENT DOCUMENTS

| | | |
|---|---|---|
| JP | 2003-039595 A | 2/2003 |
| JP | 2004-071589 A | 3/2004 |
| JP | 2007-273530 A | 10/2007 |

(56) References Cited

FOREIGN PATENT DOCUMENTS

| JP | 2008-235545 A | 10/2008 |
|---|---|---|
| TW | 559955 | 11/2003 |
| WO | 2005/107350 A | 11/2005 |

OTHER PUBLICATIONS

ISR issued in PCT/JP2015/054832, dated May 19, 2015.
W.C. Oliver and G.M. Pharr, J Mater. Res., vol. 7, No. 6, p. 1564, Jun. 1992.

* cited by examiner

COPPER CLAD LAMINATE FOR FORMING OF EMBEDDED CAPACITOR LAYER, MULTILAYERED PRINTED WIRING BOARD, AND MANUFACTURING METHOD OF MULTILAYERED PRINTED WIRING BOARD

TECHNICAL FIELD

The present invention relates to a copper clad laminate for forming of an embedded capacitor layer, a multilayered printed wiring board embedded a capacitor circuit, and a manufacturing method of the multilayered printed wiring board embedded a capacitor circuit.

BACKGROUND ART

In a multilayered printed wiring board in recent years, a multilayered printed wiring board embedded a capacitor circuit including a capacitor circuit in the inner layer has been employed as a power supply circuit/ground circuit to achieve a uniform power distribution and reduced noise generation. Also, high speed signal transmission in a device, stable power supply to the device for operation, power saving and reduction in noise generation are considered. In particular, such a multilayered printed wiring board embedded a capacitor circuit is one of a solution for mounting of LSI chips having increased wiring density and enlarged size used in a communication apparatus for infrastructure, a network server, a supercomputer and the like.

As a technique related to the multilayered printed wiring board embedded a capacitor circuit, Patent Document 1 discloses a multilayered printed wiring board embedded a capacitor circuit including a capacitor circuit (embedded capacitor circuit) having a layer structure "conductive foil/dielectric sheet/conductive foil" in the inner layer of a multilayered printed wiring board (Patent Document 1 refers to as "capacitive printed wiring substrate").

If the multilayered printed wiring board embedded a capacitor circuit manufactured by the method disclosed in Patent Document 1 is sued in a communication apparatus for infrastructure, a network server, a supercomputer and the like described above, the voltage of the power supply circuit can be made lower but a large electric current is required. To pass a large current without heat generation in the power supply circuit, increase of thickness of the conductor is required to lower the electric resistance of the conductor. So, in the power supply and ground circuit design, thick copper layer is used to lower electric resistance with a widened cross sectional area of the wiring.

In forming of the capacitor circuit of the multilayered printed wiring board embedded a capacitor circuit disclosed in Patent Document 1 described above, a double-sided copper clad laminate having a layer structure of "copper layer/dielectric layer of the capacitor/copper layer" is preferable to be used. Further, the double-sided copper clad laminate disclosed in Patent Document 2 is preferable to be used to suitably form the embedded capacitor circuit in the multilayered printed wiring board embedded a capacitor circuit disclosed in Patent Document 1.

Patent Document 2 discloses an object, "to provide a double-sided copper clad laminate for forming of the capacitor layer provided with an insulating layer excellent in break down voltage properties without causing a short circuit with voltage application between copper foil and not broken by showering pressure in etching for wiring forming", and "the double-sided copper clad laminate for forming of the capacitor layer provided with a conductive copper foil layer on the outer layer on both sides and a dielectric resin layer sandwiched between the copper foil layers, wherein the resin layer has a there layer structure composed of thermosetting resin layer/heat-resistant film layer/thermosetting resin layer and a total thickness of 25 µm or less. The thermosetting resin layer is composed of epoxy-based resin material, the heat-resistant film layer as-received has a Young's modulus of 300 kg/mm$^2$ or more, a tensile strength of 20 kg/mm$^2$ or more, elongation of 5% or more, a softening temperature is higher than the laminating temperature of the thermosetting resin constituting the thermosetting resin layers on both sides and the epoxy resin material has a relative dielectric constant of 2.5 or more".

In general, the capacitance of the capacitor circuit is higher as the dielectric constant of a dielectric layer increases and as the thickness of a dielectric layer decreases. So the thickness of a dielectric layer should be thin as much as possible. However, excessively thin dielectric layer has drawback that the break down voltage between the top electrode and the bottom electrode in the capacitor circuit becomes low and causes a short circuit. In the double-sided copper clad laminate disclosed in Patent Document 2, a strong and heat resistant film is arranged in the dielectric layer. The film in the dielectric layers can surely prevent contact between the top electrode and the bottom electrode of the finished capacitor circuit provided with a thin dielectric layer and assure excellent dielectric strength. So, the double-sided copper clad laminate disclosed in Patent Document 2 is preferable to be used in the invention disclosed in Patent Document 1.

DOCUMENTS CITED

Patent Document

[Patent Document 1] Japanese Patent No. 2738590
[Patent Document 2] Japanese Patent Laid Open No. 2003-39595

SUMMARY OF INVENTION

Problems to be Solved by the Invention

However, a complicated circuit design is required for a multilayered printed wiring board embedded a capacitor circuit used in a communication apparatus for infrastructure, a network server, a supercomputer and the like described above in general. In particular, the circuit design tends to arrange most of the through-holes in high density in the area where BGAs are mounted in a multilayered printed wiring board embedded a capacitor circuit as clearance holes without electrical connection to the power supply circuit and the ground circuit.

Under such circumstances, if the double-sided copper clad laminate disclosed in Patent Document 2 is used in manufacturing of the capacitor circuit-embedded multilayered printed wiring board disclosed in Patent Document 1 and holes are bored by drilling, the drawback generation of cracks appears in the dielectric layer of the capacitor. The drawback generation of cracks in the dielectric layer of the capacitor in drilling tends to occur more easily as layers in the multilayered printed wiring board embedded a capacitor circuit increase. The same drawback tends to occur more easily as the copper layer constituting the capacitor circuit thick.

Figure 6:
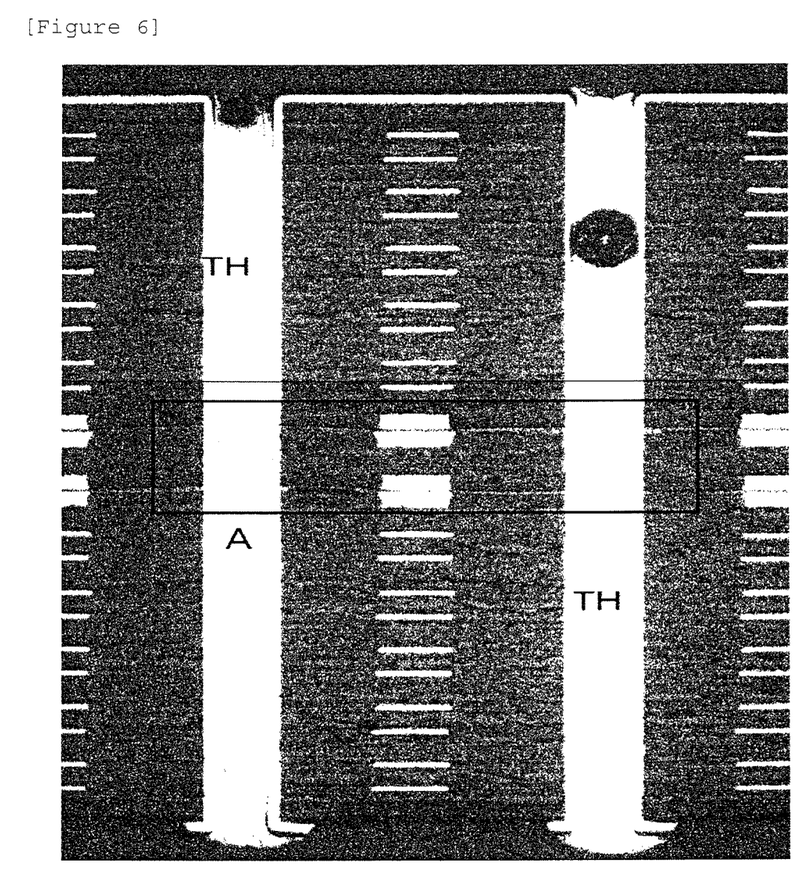
FIG. 6 is the cross-sectional photographic image of a multilayered printed wiring board (26 layers) embedded a capacitor circuit including a through-hole bored by drilling observed by a metallographical microscope (50 times magnification).
Figure 7:
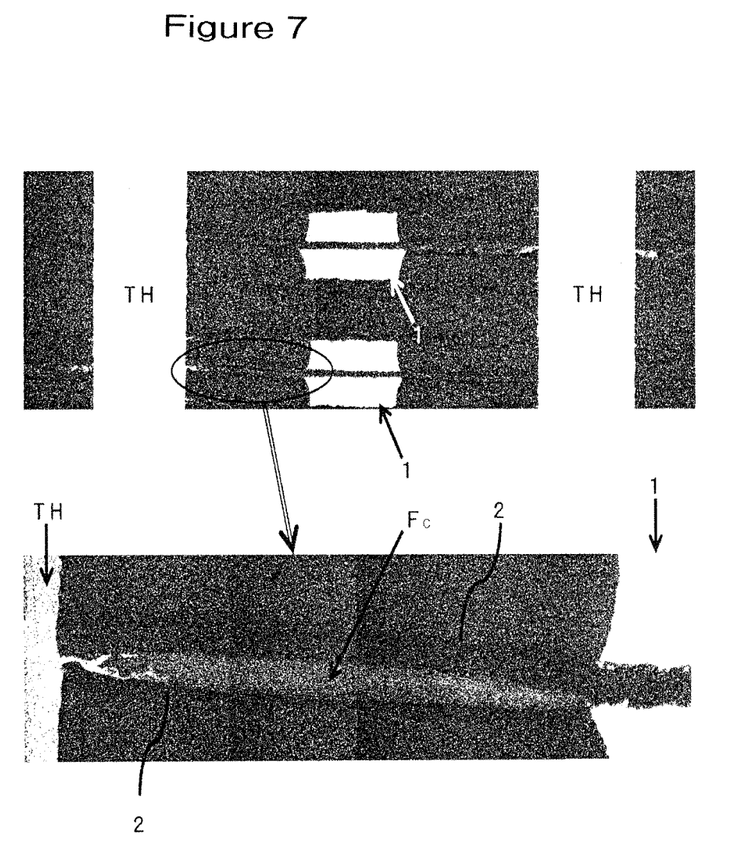
FIG. 7 is the cross-sectional photographic image of a crack generated in the dielectric layer of the capacitor of the multilayered printed wiring board embedded a capacitor circuit shown in FIG. 6, observed under magnification by a metallographical microscope (100 times and 500 times magnification).

FIG. 6 shows a cross-sectional photographic image including a through-hole in a multilayered printed wiring board embedded a capacitor circuit (26 layers) formed a through holes TH by boring the holes by drilling followed by copper plating the holes. Then, a crack $F_C$ in a dielectric layer of the capacitor 2 is observed in the rectangular region A in the FIG. 6. FIG. 7 shows the enlarged rectangular area A. As is obvious in the drawings, a large crack $F_C$ is observed in the dielectric layer of the capacitor 2. If such a crack generates in the dielectric layer of the capacitor 2, it is hard to achieve intended dielectric constant and suitable through-hole plating and may cause a short circuit. Furthermore, it is not preferable because of the drawback such as delamination caused by gas expansion in the crack under high temperature environment, such as in soldering or the like in the subsequent process for manufacturing a printed wiring board.

So, no crack generation in the dielectric layer of the capacitor has been required in boring of holes for a through-hole by drilling in manufacturing of a highly multilayered printed wiring board embedded a capacitor circuit.

Means to Solve the Problem

As a result of diligent study of the present inventors, prevention of crack generation in the dielectric layer of the capacitor of a highly multilayered printed wiring board embedded a capacitor circuit in drilling of the holes for forming of a through-hole was thought out. That is, application of "a copper clad laminate for forming of an embedded capacitor layer", "a multilayered printed wiring board embedded a capacitor circuit" and "a manufacturing method of a multilayered printed wiring board embedded a capacitor circuit" described below are the measures. The outline of the invention disclosed in the present application will be described below.

<Copper Clad Laminate for Forming of Embedded Capacitor Layer>

The copper clad laminate for forming of an embedded capacitor layer according to the present invention is a copper clad laminate for forming of an embedded capacitor layer of a multilayered printed wiring board including an embedded capacitor circuit having a layer structure of copper layer/dielectric layer of the capacitor/copper layer in an inner layer characterized in that the dielectric layer of the capacitor contains at least a resin film as a constituent material; the composite elastic modulus Er of the resin film along the thickness direction is less than 6.1 GPa.

<Multilayered Printed Wiring Board Embedded a Capacitor Circuit>

The multilayered printed wiring board embedded a capacitor circuit according to the present invention comprises a through-hole bored by drilling and an embedded capacitor layer including an embedded capacitor circuit, the multilayered printed wiring board embedded a capacitor circuit is characterized in that the composite elastic modulus Er of a resin film constituting a dielectric layer of the capacitor constituting the embedded capacitor circuit along the thickness direction is less than 6.1 GPa.

<Manufacturing Method of Multilayered Printed Wiring Board Embedded a Capacitor Circuit>

The manufacturing method of a multilayered printed wiring board embedded a capacitor circuit according to the present invention is characterized in including the following steps.

Manufacturing step of multilayered laminate: A multilayered laminate having a desired number of layers is manufactured through, preparing of a capacitor circuit-provided laminate provided with an electrode circuit on the surface of a dielectric layer of the capacitor comprising a resin film having the composite elastic modulus Er of less than 6.1 GPa as a constituent material; and laminating of required number of printed wiring boards having two or more layers on both sides of the capacitor circuit-provided laminate via an insulating layer-constituting material;

Boring step: Holes for forming of a through-hole is bored by drilling in the multilayered laminate at required points; and Finishing step: The multilayered printed wiring board embedded a capacitor circuit is manufactured after boring of the holes for forming of a through-hole through, forming of an outer wiring after conducting necessary processing including smear removal by desmearing, forming of interlayer connection, and plating treatment.

Advantages of Invention

The copper clad laminate for forming of an embedded capacitor layer according to the present invention specifies the composite elastic modulus Er of a resin film constituting the dielectric layer of the capacitor along the thickness direction less than 6.1 GPa. The embedded capacitor layer in the multilayered printed wiring board embedded a capacitor circuit manufactured by using the copper clad laminate for forming of the embedded capacitor layer is prevented crack generation in drilling of the dielectric layer of the capacitor for boring of holes for forming of a through-hole. That is, as the multilayered printed wiring board embedded a capacitor circuit manufactured by using the copper clad laminate for forming of the embedded capacitor layer according to the present invention is provided with an excellent capacitor circuit without damage on the dielectric layer of the capacitor, the multilayered printed wiring board embedded a capacitor circuit achieves stable capacitance.

Generation of cracks in a dielectric layer in boring of holes for forming of a through-hole by drilling tend to be severe in a multilayered printed wiring board embedded a capacitor circuit having 8 or more layers. However, a multilayered printed wiring board embedded a capacitor circuit having 8 or more layers having holes for forming of a through-hole bored by drilling is provided a dielectric layer of the capacitor without generation of a crack if the manufacturing method of a multilayered printed wiring board embedded a capacitor circuit according to the present invention is employed.

PREFERRED EMBODIMENTS OF THE INVENTION

Prior to the demonstration of the embodiments of the present invention, the mechanism of the crack generation assumed by the inventors of the present invention is described below. In general, an insulating layer-constituting material used in lamination of a multilayered printed wiring board is a prepreg impregnated with a thermosetting resin or the like into a reinforcing material such as glass cloth, glass paper, resin fiber cloth, and resin fiber paper. The prepreg cured after heating and cooled tends to have a smaller thermal expansion coefficient as the density of glass in a glass cloth increases. However, the vicinity of clearance holes of the multilayered printed wiring board embedded a capacitor circuit described above where BGA is mounted are filled only by the resin flew out from the prepreg in the multiplying lamination. If so, the resin content extremely increases in the vicinity of a clearance hole if a multilayered printed wiring board embedded a capacitor circuit including a power supply circuit layer/ground circuit layer in 3 or more layers is manufactured to have a power supply circuit/ground circuit formed using a copper layer with a thickness of 70 μm or more.

Consequently, after curing of the resin component in the insulating layer-constituting material in lamination, the strain along the thickness direction extremely increases in the vicinity of the clearance hole where the reinforcing material described above is absent in the multilayered printed wiring board embedded a capacitor circuit, due to the "cure shrinkage" of the filled resin. The matter was guessed that if the strain along the thickness direction increase, cracks easily generate in a dielectric layer of the capacitor at the vicinity of the central part of the multilayered printed wiring board embedded a capacitor circuit where the strain along the thickness direction may be accumulated by drilling. So, the present invention was thought out while paying attention to the strain along the thickness direction of the multilayered printed wiring board embedded a capacitor circuit and conducted a diligent study on the conditions not to generate cracks in a dielectric layer of the capacitor by drill bit feeding even if strain generates along the thickness direction.

Hereinafter, the embodiments of the present invention: "embodiment of copper clad laminate for forming of embedded capacitor layer", "embodiment of multilayered printed wiring board embedded a capacitor circuit", and "embodiment of manufacturing method of multilayered printed wiring board embedded a capacitor circuit" will be described one by one.

<Embodiment of Copper Clad Laminate for Forming of Embedded Capacitor Layer>

Figure 1:
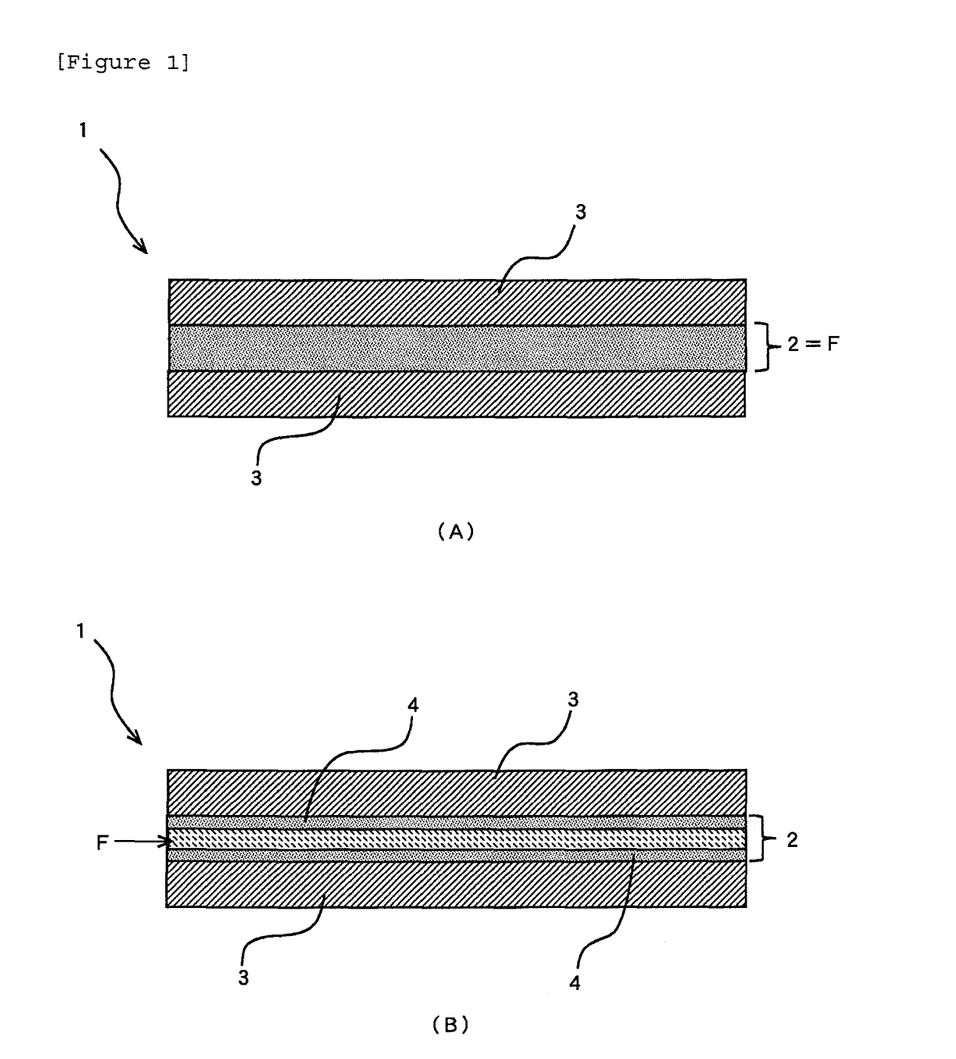
FIG. 1 is the schematic cross-sectional image of a copper clad laminate for forming of an embedded capacitor layer according to the present invention.

The copper clad laminate for forming of embedded capacitor layer according to the present invention is a copper clad laminate used in forming of embedded capacitor layer as an inner layer of a multilayered printed wiring board having a layer structure of "copper layer/dielectric layer of the capacitor/copper layer". The present copper clad laminate is provided the copper layer 3 on both sides of the dielectric layer of the capacitor 2 as shown in FIG. 1. So, the embedded capacitor circuit manufactured using the copper clad laminate for forming of an embedded capacitor layer also has the layer structure of "copper layer/dielectric layer of the capacitor/copper layer". Then, items will be described. It should be noted that the thickness of each layers such as the dielectric layer of the capacitor 2, a copper layer 3, and the resin film F shown in the schematic cross sectional image in the drawings of the present application does not reflect the actual thickness.

Dielectric layer of the capacitor: The dielectric layer of the capacitor of the copper clad laminate for forming of the embedded capacitor layer according to the present invention contains at least the resin film as the constituent material, and is characterized in that the composite elastic modulus Er of the resin film along the thickness direction is less than 6.1 GPa. The words "dielectric layer of the capacitor contains at least a resin film as a constituent material" means that the dielectric layer of the capacitor 2 employs the layer structure of just "resin film layer" as in FIG. 1 (A) and employs the 3-layer structure of "resin layer 4/resin film layer F/resin layer 4" as in FIG. 1 (B). The dielectric layer of the capacitor 2 may employ the 2-layer structure of "resin layer 4/resin film layer F" even not shown in drawings.

If the composite elastic modulus Er of the resin film is 6.1 GPa or more, cracks easily generate in the dielectric layer of the capacitor in drilling for boring holes for forming of a through-hole in the manufacturing process of a multilayered printed wiring board embedded a capacitor circuit. The generated cracks damages the function as a dielectric layer. In other words, if the composite elastic modulus Er of the resin film is less than 6.1 GPa, the generation of cracks in the dielectric layer of the capacitor can be prevented through relaxation and absorption of the strain caused by drill feeding on a printed wiring board in the manufacturing process. Although the lower limit of the composite elastic modulus Er along the thickness direction of the resin film is not particularly limited, the typical value is 0.1 GPa in consideration of the rigidity, strength, etc. required on a copper clad laminate.

The composite elastic modulus of the resin film is measured by a nano indentation method in the present invention. The nano indentation method conducts continuous rigidity measurement 5 times on a resin film as a measuring object fixed on a stage. The measured data is analyzed and the composite elastic modulus of the resin film is determined with assumed Poisson's ratio of 0.3. In the measurement, a typical apparatus trade name Nano Indenter XP manufactured by MTM Systems is used with a triangular pyramid-shaped indenter Berkovich.

If the capacitor 2 employs the layer structure of just "resin film layer" shown in FIG. 1 (A), the resin film including a resin component satisfying the composite elastic modulus described above and excellent in dielectric properties can be used as the resin film in the dielectric layer without particular limitation. For example, an epoxy resin, a polyimide resin, a polyamide resin, a polyamideimide resin, a polyphenylene ether resin, a cyanate resin, a polyolefin resin, a liquid crystal polymer, and a syndiotactic polystyrene resin may be used as the "resin component excellent in the dielectric properties" suitable for the resin film. More specifically, polyethylene terephthalate resin, polyethylene naphthalate resin, polyvinyl carbazole resin, polyphenylene sulfide resin, a polyamide resin, an aromatic polyamide resin, a polyamideimide resin, a polyether sulfone resin, a polyether nitrile resin, a polyether ether ketone resin, and a polyimide resin, etc. are preferable to be used.

The thickness of the dielectric layer of the capacitor 2 employing the layer structure of just "resin film layer" is preferable to be 30 μm or less. The capacitance of the capacitor 2 is inversely proportional to the thickness of the dielectric layer of the capacitor. So, the capacitance and the amount of charged capacity increase as the thickness of the dielectric layer of the capacitor decreases. The charged capacity is used as a part of electrical power source, and it contributes to power saving. Even though the thickness of the dielectric layer of the capacitor 2 should be determined in the product design or circuit design, the thickness is specified to be 30 μm or less in the present invention in consideration of the requirement in the market. Although the lower limit of the thickness of the dielectric layer of the capacitor 2 is not limited as long as the copper layers arranged on both sides of the dielectric layer of the capacitor 2 do not with each other, the thickness is preferable to be 0.5 μm or more, and is more preferable to be 5 μm or more to secure prevention of the short circuit. However, the cracks tend to generate in the dielectric layer of the capacitor according to the present invention as the thickness of the dielectric layer of the capacitor increases. So, in the technical concept of the present invention, preventing of the crack generation is effective if the thickness of the dielectric layer of the capacitor is 12 μm to 30 μm.

The resin film constituting the dielectric layer of the capacitor 2 may contain a dielectric filler depending on the quality design of the capacitor circuit. The matrix of the resin film described above is preferable to contain a dispersed perovskite "dielectric filler" such as a barium titanate ceramic, a lead titanate ceramic, a calcium titanate ceramic, a magnesium titanate ceramic, a bismuth titanate ceramic, a strontium titanate ceramic, and a lead zirconate ceramic.

The copper clad laminate for forming of an embedded capacitor layer including the dielectric layer of the capacitor 2 having the just "resin film layer" described above may be manufactured by laminating the resin film between two copper foils. Or, the copper clad laminate may be manufactured by forming the resin film layer on the surface of the copper foil by the casting method followed by laminating of the copper foil on the surface of the resin film layer. Furthermore, resin film layer can be formed between two copper foils by laminating two resin coated copper foils having the resin layer on the surface of the copper foils. The casting method forms a polyimide resin film layer directly on the surface of the copper foil through forming of a film of resin composition, such as polyamic acid to be polyimide resin after heating, on the surface of the copper foil and heating for a condensation reaction.

A dielectric layer of the capacitor 2 employing the 3-layer structure of "resin layer 4/resin film layer F/resin layer 4" shown in FIG. 1 (B) is also preferable. The reason is that if the resin film F is provided in the central part of the dielectric layer of the capacitor, possibility of the short circuit caused by contacting of the surfaces of copper layers on both sides of a dielectric layer of the capacitor can be fully eliminated.

The resin film layer F in the dielectric layer of the capacitor 2 having the 3-layer structure should also satisfy the composite elastic modulus described above. If the resin film layer F does not satisfy the composite elastic modulus described above, the various objects of the present invention cannot be achieved. For the dielectric layer of the capacitor 2 having the 3-layer structure, the preferable resins for the resin film layer F include a polyethylene terephthalate resin, a polyethylene naphthalate resin, a polyvinyl carbazole resin, a polyphenylene sulfide resin, a polyimide resin, a polyamide resin, an aromatic polyamide resin, a polyamideimide resin, a polyether sulfone resin, a polyether nitrile resin, and a polyether ether ketone resin. Among these, the polyimide resin is preferable. Also in the dielectric layer of the capacitor 2 having the 3-layer structure, the matrix of the resin film layer F is preferable to contain the "dielectric filler" dispersed as described above for increasing of the relative dielectric constant and the capacitance of the capacitor circuit.

Even the resin layer 4 is not particular limited as long as excellent in adhesion between the copper layer 3 and the resin film layer F, an epoxy resin, a polyimide resin, a polyamide resin and a polyamideimide resin are preferable to be used as the resin component for the resin layer 4. If a polyimide resin is used for the resin layer 4, a thermoplastic polyimide resin is preferable. To ensure excellent adhesion between the copper layer 3 and the resin film layer F, these resin components may be appropriately used and blended to adjust the composition. Furthermore, the resin layer may contain the "dielectric filler" described above depending on the design quality of the capacitor circuit.

Thickness of each layer in the dielectric layer of the capacitor 2 having the layer structure of "resin layer 4/resin film layer F/resin layer 4" will be described. The thickness of the resin film F is typically designed to be thicker than the sum thickness of the two resin layers 4. Thickness of the "resin film F" used is preferable to be 0.5 μm to 25 μm, more preferable to be 2 μm to 20 μm. In contrast, thickness of the resin layer 4 is preferable to be 0.1 μm to 10 μm, more preferable to be 2 μm to 7 μm.

The copper clad laminate for forming of the embedded capacitor layer including the dielectric layer of the capacitor 2 having the layer structure of "resin layer 4/resin film layer F/resin layer 4" described above can be manufactured by arranging the resin film between the two resin coated copper foils facing the resin surfaces each other followed by laminating. Alternatively, the copper clad laminate can be manufactured by laminating the resin film on the surface of the resin layer of the resin coated copper foil followed by laminating the resin surface of another resin coated copper foil on the resin film surface.

Copper layer: Concept of the copper layer 3 of the copper clad laminate for forming of the embedded capacitor layer 1 according to the present invention includes "copper layer constituted of a copper foil", "copper layer constituted of a copper foil and a plated copper layer", and "a copper layer formed by electro-less plating over a seed layer on the dielectric layer of the capacitor".

Although the thickness of the copper layer 3 is not particularly limited as long as a power supply circuit/ground circuit can be formed, the thickness is preferable to be 18 μm to 105 μm from the viewpoint of practical use. If the thickness of the copper layer 3 is 18 μm or more, a power supply circuit/ground circuit with less heat generation caused by electric resistance can be formed. The cracks generate in the dielectric layer of the capacitor in the present invention tend to increase as the thickness of the copper layer used in the copper clad laminate for forming of an embedded capacitor layer increases. So, the copper clad laminate 1 for forming of an embedded capacitor layer according to the present invention can enjoy crack generation free if the dielectric layer of the capacitor 2 has the composite elastic modulus Er along the thickness direction of less than 6.1 GPa even the thickness of the copper layer 3 used is 35 μm or more. Further, if the thickness of the copper layer 3 is 70 μm or more, the cracks may possibly generate. However, the copper clad laminate 1 for forming of an embedded capacitor layer can be reduced crack generation by using the resin film constituting the dielectric layer of the capacitor having the composite elastic modulus Er along the thickness direction of less than 6.1 Gpa if the copper layer 3 is so thick. Furthermore, the thickness of the copper layer 3 of more than 105 μm or more may cause no particular problem. However, as such special market needs for the forming a power supply circuit/ground circuit with the copper layer having the thickness of more than 105 μm does not exists, it is waste of resources.

Figure 2:
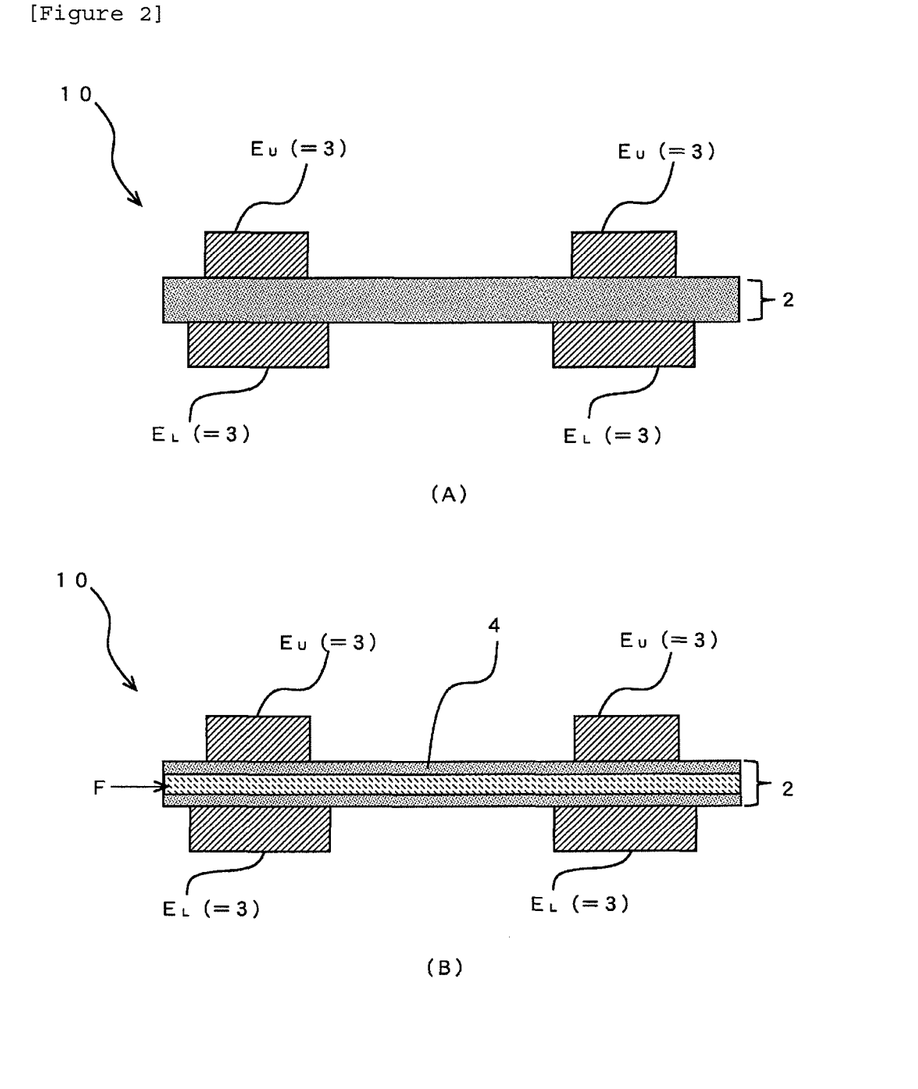
FIG. 2 is the schematic cross-sectional image of the capacitor circuit-provided laminate manufactured by forming a wiring on the copper clad laminate for forming of an embedded capacitor layer according to the present invention.

The copper layer 3 of the copper clad laminate for forming of the embedded capacitor layer 1 is used for forming the top electrode and the bottom electrode in the capacitor circuit. In other words, the wiring is formed using the copper layer 3, the top electrode $E_U$ (=copper layer 3) and the bottom electrode $E_L$ (=copper layer 3) of the capacitor circuit are formed, and the capacitor circuit having the dielectric layer of the capacitor 2 provided between the top electrode $E_U$ and the bottom electrode $E_L$ is formed to finish the capacitor circuit-provided laminate 10 as shown in FIG. 2. So, even the capacitor circuit has the layer structure of "copper layer/dielectric layer of the capacitor/copper layer", the layer structure may be also referred to as "top electrode $E_U$/dielectric layer of the capacitor 2/bottom electrode $E_L$". These words will be used in the present invention according to needs.

<Embodiment of Multilayered Printed Wiring Board Embedded Capacitor Circuit>

The multilayered printed wiring board embedded the capacitor circuit according to the present invention is provided the through-hole bored by drilling and the embedded capacitor layer characterized in that the composite elastic modulus Er of the resin film constituting the dielectric layer of the capacitor constituting the embedded capacitor layer along the thickness direction is less than 6.1 GPa. Regarding "composite elastic modulus in thickness direction of resin film constituting dielectric layer of the capacitor constituting the embedded capacitor layer", "thickness of the embedded capacitor layer of the multilayered printed wiring board embedded a capacitor circuit according to present invention", "layer structure of resin layer/resin film layer/resin layer of a dielectric layer of the capacitor constituting the embedded capacitor layer", and "thickness of the electrode circuit formed on both sides of the embedded capacitor layer constituting the capacitor circuit", the reasons and bases are the same as described above on the copper clad laminate for forming of an embedded capacitor layer according to the present invention. So, the descriptions on these items will be omitted to avoid redundant description. Hereinafter, just the items not described on the copper clad laminate for forming of an embedded capacitor layer according to the present invention will be described.

Target of the multilayered printed wiring board embedded a capacitor circuit according to the present invention is preferable to have a total thickness of 1.8 mm or more and 8 layers or more. The words "total thickness" is a thickness of a multilayered printed wiring board embedded a capacitor circuit conducted a drilling process. If the total thickness exceeds 1.8 mm, cracks easily generate in the dielectric layer of the capacitor when holes for forming of a through-hole are bored by drilling in the manufacturing process of a printed wiring board. Although target of the multilayered printed wiring board embedded a capacitor circuit has 8 or more layers, the cracks tend to generate in the dielectric layer of the capacitor as the number of layers of the multilayered printed wiring board embedded the capacitor circuit increases. In particular, the cracks tend to be further easily generate in the multilayered printed wiring board embedded the capacitor circuit having 16 or more layers with a high resin content in the vicinity of a clearance hole including a power supply circuit/ground circuit, and tend to be furthermore easily generate in the board having 20 layers or more. So, target of the present invention is preferable to be a multilayered printed wiring board embedded a capacitor circuit having such a number of layers. It should be noted that the words "8 layers" and "16 layers" represent the number of conductive layers. As is apparent in the descriptions above, if the multilayered printed wiring board embedded a capacitor circuit according to the present invention has total thickness of 1.8 mm or more and 8 or more layers, and satisfy the specification described above, the crack generation in the dielectric layer of the capacitor in the vicinity of a clearance hole including a power supply circuit/ground circuit with a high resin content is prevented even if holes for forming of a through-hole is bored by drilling.

<Embodiment of Manufacturing Method of Multilayered Printed Wiring Board Embedded a Capacitor Circuit>

The manufacturing method of a multilayered printed wiring board embedded a capacitor circuit according to the present invention is characterized in including the following steps. Steps will be described one by one.

Manufacturing step of multilayered laminate: In the manufacturing steps, the capacitor circuit-provided laminate provided with a capacitor circuit on the surface of the dielectric layer of the capacitor shown in FIG. 2 is manufactured first. The dielectric layer of the capacitor contains the resin film having the composite elastic modulus Er of less than 6.1 GPa as the constituent material. The capacitor circuit-provided laminate is provided the copper layer to be the top electrode in the capacitor circuit on one side of the dielectric layer of the capacitor and the copper layer to be the bottom electrode of the capacitor circuit on another side of the dielectric layer of the capacitor. The laminate can be manufactured by the following method.

The capacitor circuit-provided laminate can be manufactured by a subtractive method. In particular, as the copper clad laminate for forming of an embedded capacitor circuit having the layer structure of copper layer/dielectric layer of the capacitor/copper layer in the inner layer of the multilayered printed wiring board, the copper clad laminate for forming of the embedded capacitor layer 1 provided with the copper layer on both sides of the dielectric layer of the capacitor which contains the resin film having the composite elastic modulus Er along the thickness direction of less than 6.1 GPa as the constituent material is prepared. The schematic cross-sectional image of the copper clad laminate for forming of the embedded capacitor layer 1 is shown in FIG. 1. Then, the capacitor circuit-provided laminate 10 shown in FIG. 2 is manufactured by forming the wiring of the capacitor circuit having the layer structure of "top electrode $E_U$/dielectric layer of the capacitor 2/bottom electrode $E_L$" on both sides of the copper clad laminate 1 for forming of an embedded capacitor layer.

Alternatively, the capacitor circuit-provided laminate 10 may be manufactured by a semi-additive method using a copper foil. In particular, the capacitor circuit having the layer structure described above can be formed through, preparation of the copper clad laminate for forming of the embedded capacitor layer 1 formed by laminating of ultra-thin copper foils with a carrier foil, pattern plating of copper in the shape of the capacitor circuit on the exposed surface of the ultra-thin copper foil after releasing the carrier foil from the surface, and flash etching of the ultra-thin copper foil exposed between the wirings.

Further, the capacitor circuit-provided laminate 10 may be manufactured by a semi-additive method also, using a seed layer. In particular, the capacitor circuit including the layer structure described above can be formed through, providing of the seed layer on the both surfaces of the dielectric layer of the capacitor, a pattern plating on the seed layer in the wiring shape and flash etching of the seed layer exposed between wirings.

The multilayered laminate having the desired number of layers is manufactured by laminating required number of the printed wiring boards having two or more layers on both sides of the capacitor circuit-provided laminate manufactured as described above via the insulating layer-constituting material. In one example shown in FIG. 3 (A), the multilayered laminate 20 shown in FIG. 4 (B) is manufactured through, facing two capacitor circuit-provided laminates 10 (the capacitor circuit-provided laminates shown in FIG. 2 (B) are used) via an insulating layer-constituting material 5 (PP0), then alternately stacking the insulating layer-constituting material 5 (PP1 to PPn) and the printed wiring boards PWB1 to PWBn having two or more layers on the outside of each of the capacitor circuit-provided laminates 10, followed by stacking the insulating layer-constituting material 5 (PPn+1) and the copper foil 7 for forming of an outermost copper layer 3, and lamination all at once.

Figure 3:
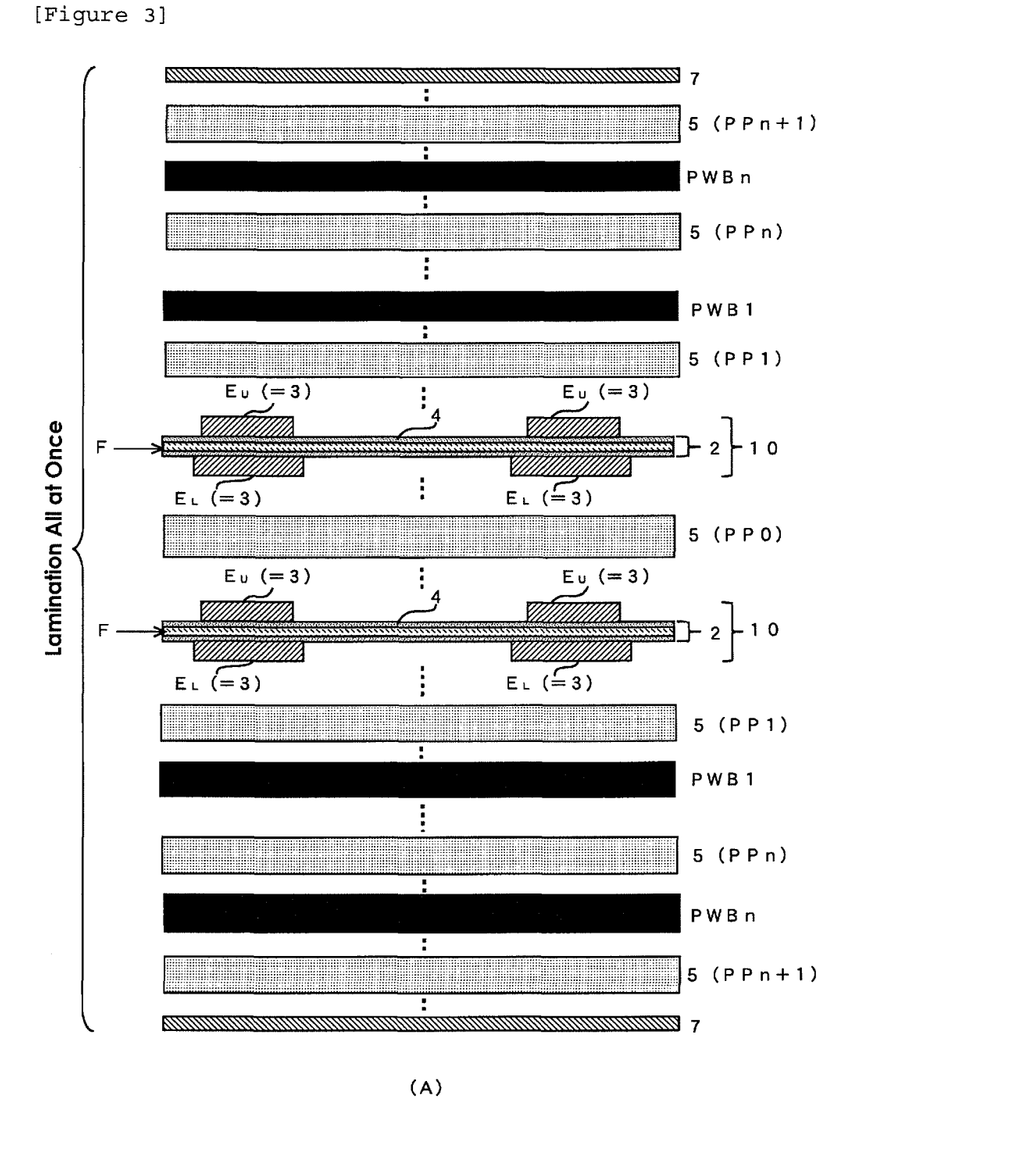
FIG. 3 is the schematic cross-sectional image for demonstrating the manufacturing process of a multilayered printed wiring board embedded a capacitor circuit according to the present invention.

In particular, a multilayered laminate can be manufactured by lamination all at once of the insulating layer-constituting materials 5 (PP1 to PPn) and printed wiring boards PWB1 to PWBn having two or more layers and the insulating layer-constituting material 5 (PPn+1) and the copper foil 7 on the surface of the capacitor circuit-provided laminate 10 as shown in FIG. 3 (A). Alternatively, a multilayered laminate can be manufactured by laminating the printed wiring board PWB1 to PWBn having two or more layers via the insulating layer-constituting material 5 sequentially on the surface of the capacitor circuit-provided laminate 10. In such a multiplying process, the multilayered laminate 20 having an intended number of layers can be quickly manufactured if the printed wiring boards PWB1 to PWBn having two or more layers is used even the multilayered laminate has layers more than 20. The insulating layer-constituting material 5 is not particularly limited as long as the material can be used as insulating layer of a printed wiring board such as a prepreg and a resin sheet. The printed wiring boards PWB1 to PWBn having two or more layers used in the lamination may be manufactured by any kind of manufacturing method. In particular, in manufacturing of the printed wiring boards PWB1 to PWBn having two or more layers, any material can be used as long as the copper layer and the insulating layer-constituting material are applicable in manufacturing of a printed wiring board. Further, the printed wiring boards may be provide a connection means between layers such as via holes or various kinds of plating.

Boring step: In this step, holes 6 for forming of a through-hole is bored at the required position by drilling on the multilayered laminate 20 manufactured as described above shown in FIG. 5 (C). Regarding the typical drilling conditions in boring, the drill rotation of 60000 rpm to 200000 rpm and the drill feeding speed of 0.5 m/min to 6.0 m/min popular in boring of a printed wiring board are employed.

Finishing step: After the boring of the holes 6 for forming of the through-hole described above, interlayer connection with the through-hole should be ensured through, providing of the copper plating layer on the inner wall of the through-hole, filling of the through-hole with a conductive paste, or the like. So, desmearing for removal of a smear deposited on the inner wall of the holes 6 for forming of the through-hole by drilling (wet etching using a permanganate aqueous solution, plasma etching, etc.), the plating treatment etc. are conducted and the outer layer wiring is formed to manufacture the multilayered printed wiring board embedded the capacitor circuit (not shown in drawing).

Hereinafter, the invention disclosed in the present application will be described in more detail with reference to Examples and Comparative Example.

Example 1

In Example 1, 26 layers multilayered printed wiring board embedded the capacitor circuit having the through-hole was manufactured through the following steps, and the presence or absence of crack generation in the dielectric layer of the capacitor 2 in the vicinity of the through-hole was investigated.

Manufacturing step of the copper clad laminate for forming of embedded capacitor layer: In the step, the copper clad laminate for forming of the embedded capacitor layer was manufactured by using the resin coated copper foil provided with the 5 μm thick semi-cured resin layer on the roughening treated surface of the 70 μm thick electrodeposited copper foil and the 12.5 μm thick polyimide resin film having the composite elastic modulus Er along the thickness direction of 5.87 GPa. The copper clad laminate for forming of the embedded capacitor layer 1 having the layer structure of "copper layer 3/dielectric layer of the capacitor 2 (thickness: 22.5 μm)/copper layer 3" shown in FIG. 1 (B) was prepared by using polyimide resin film sandwiched between two sheets of the resin coated copper foil facing the resin surfaces and laminating for 1 hour under the pressing pressure of 1.5 MPa and the pressing temperature of 190° C.

Manufacturing step of the multilayered laminate: In the step, the capacitor circuit-provided laminate 10 shown in FIG. 2 (B) was prepared by forming a capacitor circuit having the layer structure of top electrode $E_U$/dielectric layer of the capacitor 2/bottom electrode $E_L$ through, laminating of the dry film on both sides of the copper clad laminate for forming of the embedded capacitor layer 1 first, conducting of exposure and development of the etching pattern in the capacitor circuit on both sides, etching of copper followed by releasing of the dry film.

Figure 4:
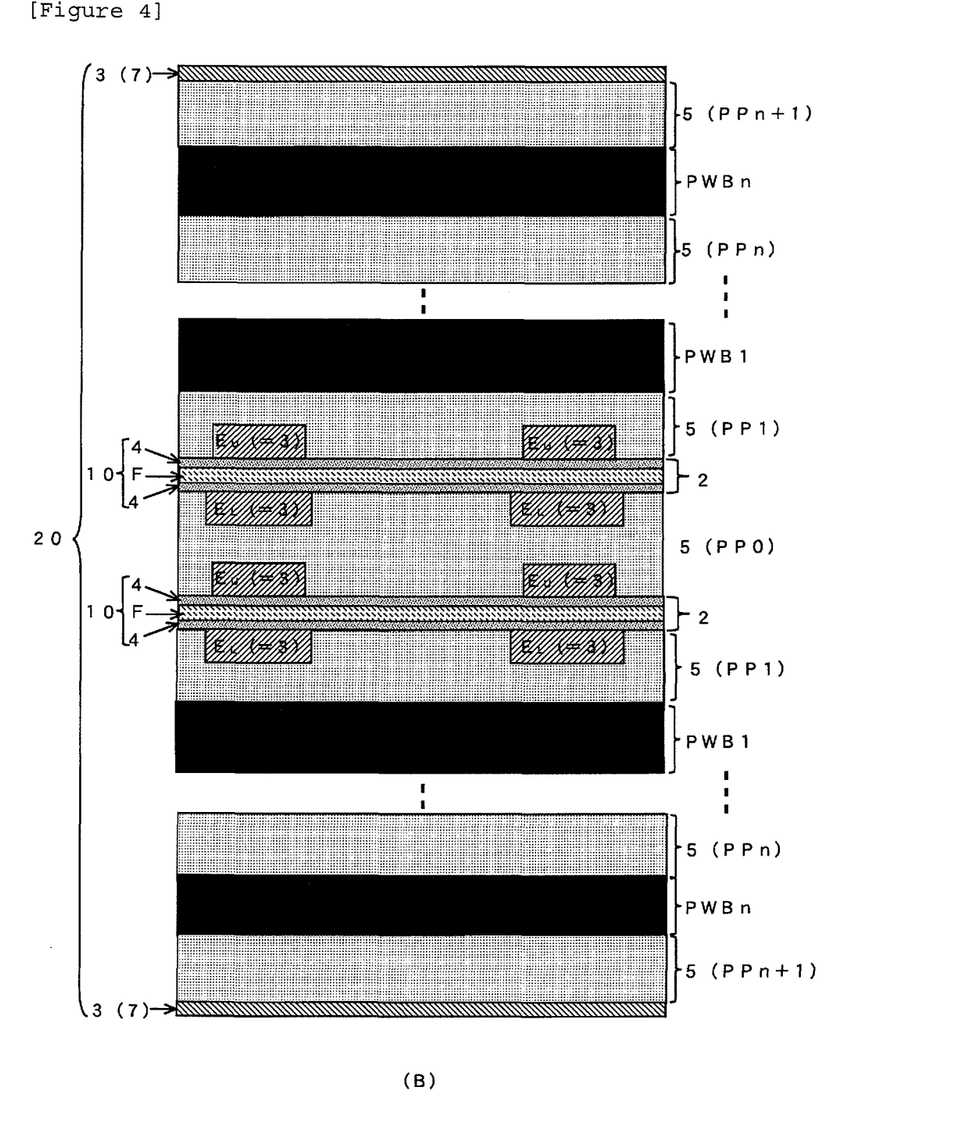
FIG. 4 is the schematic cross-sectional image for demonstrating the manufacturing process of a multilayered printed wiring board embedded a capacitor circuit according to the present invention.

Then, the 26 layers multilayered laminate 20 (total thickness: 3.2 mm) shown in FIG. 4 (B) was prepared through, sandwiching the insulating layer-constituting material 5 (PR0) between two sheets of the capacitor circuit-provided laminate 10, alternately stacking the insulating layer-constituting material 5 (PP1 to PP5) and the printed wiring boards having two or more layers PWB1 to PWB5 (insulating layer thickness: 0.1 mm, conductor thickness: 18 μm) on the out side of each of the capacitor circuit-provided laminate 10 as shown in FIG. 3 (A). Then, stacking the insulating layer-constituting material 5 (PPn+1) and the 18 μm thick cooper foil 7 for forming of the outermost copper layer 3 on the outermost layer, followed by lamination all at once. The insulating layer-constituting material 5 (PP0, PP1 to PP5, and PPn+1) for each layer is composed of two sheets of 0.05 mm thick prepreg (MEGTRON 6, manufactured by Panasonic Corporation).

Figure 5:
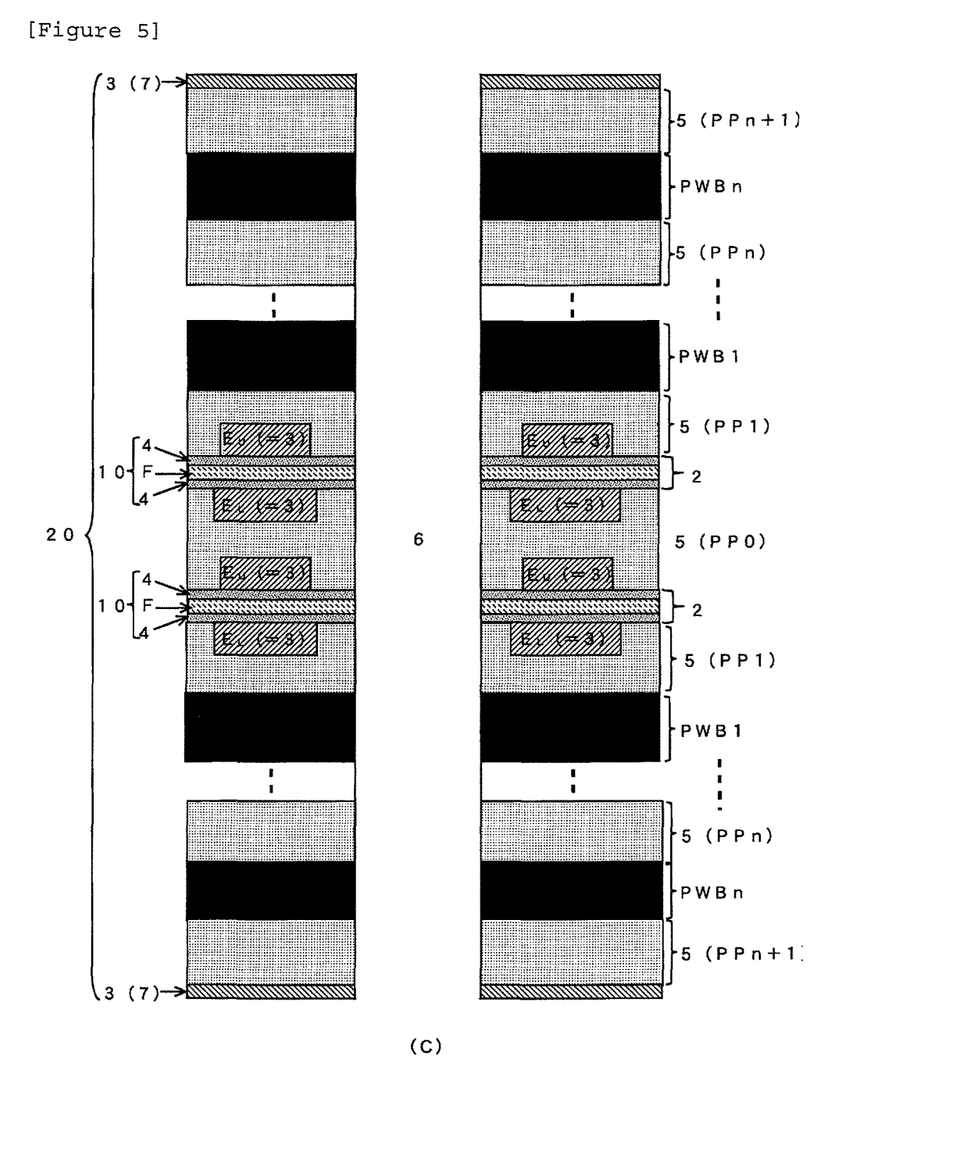
FIG. 5 is the schematic cross-sectional image for illustrating the manufacturing process of a multilayered printed wiring board embedded a capacitor circuit according to the present invention.

Boring step: In the step, holes 6 for forming of the through-hole were bored by drilling at the required position in the multilayered laminate 20 prepared as shown in FIG. 5 (C). Specifically, the drilling conditions were, drill rotation of 200000 rpm and drill feeding of 4.0 m/min.

[Investigation of Crack Generation]

The prepared multilayered laminate 20 after the boring process was provided the copper plating layer on the inner wall surface of the holes 6 for forming of the through-hole, and the presence or absence of crack generation in the dielectric layer of the capacitor 2 in the vicinity of the through-hole was investigated. The presence or absence of the crack generation was investigated by 100-times magnified image of the dielectric layer of the capacitor 2 in the vicinity of the through-hole by a metallographical microscope. The investigation results are shown in Table 1.

[Investigation of Dimensional Stability]

Dimensional change of the copper clad laminate in machine direction and transverse direction of the electrodeposited copper foil for forming of the embedded capacitor layer described above were investigated after etching of the copper foil and after heating (150° C. for 30 min) in accordance with the testing method for investigation of dimensional stability specified in IPC-TM-650 2.2.4.

Example 2

In Example 2, the copper clad laminate for forming of the embedded capacitor layer 1 having the layer structure of "copper layer 3/dielectric layer of the capacitor 2 (thickness: 24.2 μm)/copper layer 3" shown in FIG. 1 (B) was prepared in the same manner as in Example 1 except 14.2 μm thick polyimide resin film having the composite elastic modulus Er along the thickness direction of 2.66 GPa was used in place of the polyimide resin film used in Example 1, followed by preparing the 26 layers multilayered printed wiring board embedded a capacitor circuit having the through-hole. The presence or absence of the crack generation and the dimensional stability were investigated in the same manner as in Example 1. The results are shown in Table 1.

Comparative Example

In Comparative Example, the copper clad laminate for forming of the embedded capacitor layer having a layer structure of "copper layer 3/dielectric layer of the capacitor (thickness: 24.2 μm)/copper layer 3" shown in FIG. 1 (B) was prepared in the same manner as in Example 1 followed by preparing the 26 layers multilayered printed wiring board embedded a capacitor circuit having a through-hole except using the 12.1 μm thick aromatic polyamide resin film having the composite elastic modulus Er along the thickness direction of 6.80 GPa in place of the polyimide resin film used in Example 1. The presence or absence of the crack generation and the dimensional stability were investigated in the same manner as in Example 1. The results are shown in Table 1.

TABLE 1

| | Dielectric layer of the capacitor | | Investigation of dimensional stability | | |
|---|---|---|---|---|---|
| | composite elastic modulus of resin film along thickness direction (GPa) | Investigation of crack generation | Direction examined | After etching copper foil (%) | After heating (150° C. for 30 min) |
| Example 1 | 5.87 | Absent | Machine Direction | −0.05 | −0.07 |
| | | | Transverse Direction | −0.04 | −0.06 |
| Example 2 | 2.66 | | Machine Direction | −0.13 | −0.23 |
| | | | Transverse Direction | −0.21 | −0.32 |
| Comparative Example | 6.80 | Present | Machine Direction | −0.03 | −0.05 |
| | | | Transverse Direction | −0.04 | −0.06 |

<Comparison Among Examples and Comparative Example>

Investigation of the presence or absence of crack generation in the dielectric layer of the capacitor 2 in the multilayered laminate 20 detects no crack generation in the dielectric layer of the capacitor 2 in the multilayered laminate 20 after the boring process prepared in Example 1 and Example 2 as obvious in Table 1. In contrast, crack generates in Comparative Example with the resin film constituting the dielectric layer of the capacitor having the composite elastic modulus Er along the thickness direction of more than 6.1 GPa.

The following matter is obvious from the investigation of dimensional stability. The smaller the value of dimensional change (absolute value) should be better in the dimensional stability. Regarding the dimensional stability, the dimensional stability are almost the same in Example 1 and Comparative Example, and is low in Example 2. Although the resin film constituting the dielectric layer of the capacitor is preferable to have a low composite elastic modulus along the thickness direction from the viewpoint of preventing the crack generation. However, the dimensional stability tends to decrease with a low composite elastic modulus of 3.0 GPa or less as in Example 2. So, a composite elastic modulus of the resin film constituting the dielectric layer of the capacitor along the thickness direction is preferable to be 3.0 GPa or more and less than 6.1 GPa to manufacture the multilayered printed wiring board embedded a capacitor circuit free from the crack generation in the dielectric layer of the capacitor and having an excellent dimensional stability.

INDUSTRIAL APPLICABILITY

As the copper clad laminate for forming of an embedded capacitor layer according to the present invention is provided with a resin film constituting the dielectric layer of the capacitor having the composite elastic modulus Er along the thickness direction in an appropriate range, the crack generation in the dielectric layer of the capacitor can be effectively prevented in drilling holes for boring of a through-hole in a manufacturing process of a printed wiring board. Consequently, a multilayered printed wiring board embedded a capacitor circuit having capacity as designed can be manufactured. Further, the manufacturing method of a multilayered printed wiring board embedded a capacitor circuit is preferable because the method can employ a conventional production method without any modification and no extra investment in equipment is required.

SYMBOL LIST

1: Copper clad laminate for forming of the embedded capacitor layer
2: Dielectric layer of the capacitor
3: Copper layer
4: Resin layer
5: Insulating layer-constituting material
6: Holes for forming of through-hole
7: Copper foil
10: Capacitor circuit-provided laminate
20: Multilayered laminate
F: Resin film
$E_U$: Top electrode
$E_L$: Bottom electrode
PWB1 to PWBn: Printed wiring boards having two or more layers

The invention claimed is:

1. A manufacturing method of a multilayered printed wiring board embedded a capacitor circuit using the copper clad laminate for forming of an embedded capacitor layer, characterized in comprising:

Manufacturing of multilayered laminate: A multilayered laminate having a desired number of layers is manufactured through, preparing of a capacitor circuit-provided laminate provided with an electrode circuit on both sides of a dielectric layer of the capacitor containing a resin film having a composite elastic modulus Er measured by a nanoindentation method of less than 6.1 GPa as a constituent material; and laminating of required number of printed wiring boards having two or more layers on both sides of the capacitor circuit-provided laminate via an insulating layer-constituting material;

Boring: Holes for forming of a through-hole are bored by drilling in the multilayered laminate at required points; and Finishing: The multilayered printed wiring board embedded a capacitor circuit is manufactured after boring of the holes for forming of a through-hole through, forming of an outer wiring after conducting necessary processing including smear removal by desmearing, forming of interlayer connection, and plating treatment.

2. The manufacturing method of a multilayered printed wiring board embedded a capacitor circuit according to claim 1, wherein number of layers of the multilayered laminate manufactured by laminating printed wiring boards having two or more layers on both sides of the capacitor circuit-provided laminate via an insulating layer-constituting material is 8 or more.

3. The manufacturing method of a multilayered printed wiring board embedded a capacitor circuit according to claim 1, wherein each layer of the multilayered laminate includes an insulating layer-constituting material.

4. The manufacturing method of a multilayered printed wiring board embedded a capacitor circuit according to claim 1, wherein the thickness of the dielectric layer of the capacitor is 30 μm or less.

* * * * *